(12) United States Patent
Horiguchi et al.

(10) Patent No.: US 6,747,509 B2
(45) Date of Patent: *Jun. 8, 2004

(54) SEMICONDUCTOR INTEGRATED CIRCUIT

(75) Inventors: Masashi Horiguchi, Kawasaki (JP); Yasushi Kawase, Kokubunji (JP); Takesada Akiba, Hachiouji (JP); Yoshinobu Nakagome, Hamura (JP); Kazuhiko Kajigaya, Iruma (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/045,105

(22) Filed: Jan. 15, 2002

(65) Prior Publication Data

US 2002/0057129 A1 May 16, 2002

Related U.S. Application Data

(63) Continuation of application No. 09/513,929, filed on Feb. 28, 2000, now Pat. No. 6,339,358, which is a continuation of application No. 09/096,456, filed on Jun. 11, 1998, now Pat. No. 6,107,869.

(30) Foreign Application Priority Data

Jun. 20, 1997 (JP) ............................................. 9-163646

(51) Int. Cl.[7] .................................................. G05F 1/10

(52) U.S. Cl. ...................................... 327/544; 327/566

(58) Field of Search ................................ 327/544, 564, 327/565, 566; 365/226; 361/601, 605, 628, 631

(56) References Cited

U.S. PATENT DOCUMENTS

| | | | | |
|---|---|---|---|---|
| 5,309,040 A | * | 5/1994 | Nakano et al. | 327/566 |
| 5,521,527 A | * | 5/1996 | Sakata et al. | 326/21 |
| 5,781,062 A | * | 7/1998 | Mashiko et al. | 327/544 |
| 5,854,561 A | * | 12/1998 | Arimoto et al. | 327/534 |
| 5,880,604 A | * | 3/1999 | Kawahara et al. | 326/83 |
| 6,107,869 A | * | 8/2000 | Horiguchi et al. | 327/544 |
| 6,339,358 B1 | * | 1/2002 | Horiguchi et al. | 327/544 |

FOREIGN PATENT DOCUMENTS

| | | |
|---|---|---|
| JP | 5-210976 | 8/1993 |
| JP | 5-347550 | 12/1993 |
| JP | 6-203558 | 7/1994 |
| JP | 6-232348 | 8/1994 |
| JP | 8-138381 | 5/1996 |

* cited by examiner

Primary Examiner—Long Nguyen
(74) Attorney, Agent, or Firm—Antonelli, Terry, Stout & Kraus, LLP

(57) ABSTRACT

It is possible to reduce the voltage drop on sub-power supply lines for reducing the subthreshold current and thereby prevent the operating speed of a logic circuit from lowering. Main power supply lines are arranged along one side of a rectangular region including a MOS logic circuit whose subthreshold current must be reduced, and a plurality of sub-power supply lines are arranged on the region in the direction perpendicular to the main power supply lines. A plurality of switching MOS transistors for selectively electrically connecting the sub-power supply lines to the main power supply line are dispersedly arranged with respect to the main power supply line. By dispersedly arranging the switching MOS transistors with respect to the main power supply line, it is possible to reduce the equivalent resistance of the sub-power supply lines compared to the case where switching MOS transistors are provided at one place.

12 Claims, 12 Drawing Sheets

SEMICONDUCTOR INTEGRATED CIRCUIT

This is a continuation of application Ser. No. 09/513,929, filed Feb. 28, 2000 (now U.S. Pat. No. 6,339,358); which is a continuation of application Ser. No. 09/096,456, filed Jun. 11, 1998 now U.S. Pat. No. 6,107,869 the entire disclosures of which are hereby incorporated by reference.

BACKGROUND OF THE INVENTION

The present invention relates to an improved circuit structure for reducing leakage current due to the subthreshold characteristic of a MOS transistor, a semiconductor integrated circuit in which the operating voltage is kept constant, and a technique effectively applied to a large-capacity DRAM (Dynamic Random Access Memory) having a storage capacity of, for example, 256 Mbit to 1 Gbit or more.

In the case of an extremely-integrated semiconductor integrated circuit such as a DRAM, the operating voltage is lowered to 2 to 2.5 V because elements are microminiaturized and the threshold voltage of a MOS transistor is lowered to 0.15 to 0.2 V (conventionally, approx. 0.4 V) for speed-up. However, the leakage current (subthreshold current) due to the subthreshold characteristic of a MOS transistor is a problem. The subthreshold current is a leakage current which flows when the gate voltage is equal to or lower than a threshold voltage and the surface is weakly inverted.

Reducing the threshold voltage is disclosed in Japanese Patent Laid-Open Nos. 8-138381/1996, 6-232348/1994, 6-203558/1994, 5-210976/1993, and 5-347550/1993.

SUMMARY OF THE INVENTION

The present inventor has studied the application of a circuit for reducing the subthreshold current (Subthreshold Current Reduction Circuit: hereafter referred to as a SCRC) of a DRAM.

In FIG. 16 showing an example of the SCRC previously studied by the present inventor, logic circuits Li to L4 represented by a CMOS inverter are objects whose subthreshold currents are to be reduced. The period for which the subthreshold current must be reduced is, e.g., the standby period for which the input signal IN inputted to the logic circuit Li is set to a low level ("L"). Thereby, to prevent the subthreshold current from being generated in MOS transistors Qn1, Qp2, Qn3, and Qp4 to be turned off in the standby state, sub-power supply lines SL1 and SL2 are provided in addition to a main power supply line ML1 to which a power supply voltage VDD is supplied and a main power supply line ML2 to which a ground voltage VSS is supplied, a switch SD is provided between the main power supply line ML1 and the sub-power supply line SL1, and a switch SS is provided between the main power supply line ML2 and the sub-power supply line SL2. The switches SD and SS are controlled to be turned off in the standby state. When the switches SD and SS are turned off, the potential of the sub-power supply line SL1 becomes lower than the power supply voltage VDD of the main power supply line ML1 and the potential of the sub-power supply line SL2 becomes higher than the ground voltage VSS of the main power supply line ML2. Thereby, a reverse bias is applied between the gate and source of each of the off MOS transistors Qn1, Qp2, Qn3, and Qp4 in the logic circuits Li to L4, and the subthreshold current is reduced.

As a result of studying the above SCRC, the present inventor has found the following problems. The first problem of the SCRC is voltage drop due to the wiring resistance of the power supply lines, particularly the sub-power supply lines. In the case of the SCRC, the number of power supply lines is doubled to 4. Therefore, it is unavoidable to reduce the width of each line from the aspect of the layout, and thereby the wiring resistance increases. When the potential of the sub-power supply line SL1 on the power supply voltage VDD side is lowered due to the wiring resistance, and the potential of the sub-power supply line SL2 on the ground voltage VSS side rises, the operating speed of a logic circuit is lowered in an operable state.

The second problem is the area occupied by the switches SS and SD. In the case of a MOS semiconductor integrated circuit, the switches SS and SD are actually realized by using MOS transistors. To prevent the operating speed of the logic gate from lowering, it is necessary to minimize the resistance while a switching MOS transistor is on. Thus, it is necessary to increase the channel width of the MOS transistor and thereby, the layout area is increased.

It is an object of the present invention to provide a semiconductor integrated circuit capable of reducing the voltage drop of a sub-power supply line for reducing the subthreshold current and, thereby, preventing the operating speed of the logic circuit from lowering.

It is another object of the present invention to provide a semiconductor integrated circuit capable of consuming less power in the wait state and realizing speed-up during the operating time.

The above and other objects and novel features of the present invention will become apparent from the description of this specification and accompanying drawings.

The outline of a representative invention among the inventions disclosed in this application is briefly described below.

That is, a plurality of switching MOS transistors for selectively connecting a main power supply line to a sub-power supply wiring are dispersedly arranged on one main power supply line. It is possible to use the following mode for the layout of main power supply lines, sub-power supply lines, and switches. Firstly, a main power supply line is provided along one side of a rectangular region including a MOS logic circuit whose subthreshold current must be reduced and a plurality of sub-power supply lines are arranged on the region in the direction perpendicular to the main power supply line. A plurality of switching MOS transistors for selectively electrically connecting a sub-power supply line with the main power supply line are dispersedly arranged on the main power supply line.

Secondly, the sub-power supply lines are arranged on the region in X and Y directions so that they are intersected and connected to each other at intersections like a so-called mesh. In this-ease, the main power supply line is provided along one side or two adjacent sides of the region.

Thirdly, the switching MOS transistors for connecting the main power supply line to the sub-power supply lines are arranged in a region immediately below the main power supply line.

When dispersedly arranging the switching MOS transistors on the main power supply line as described above, it is possible to reduce the equivalent wiring resistance of the sub-power supply lines compared to the case where switching MOS transistors are provided at one place because the distance between the MOS logic circuit whose subthreshold current must be reduced and the nearest switching MOS transistor is shortened. When MOS logic circuits whose subthreshold currents must be reduced are dispersed in the rectangular region, by arranging sub-power supply lines in the short side direction of the rectangular region, it is possible to use sub-power supply lines having a length equal to or less than the short side length of the rectangular region and further reduce the resistance components of the sub-power supply lines. Moreover, by arranging sub-power supply lines like a mesh so that power is fed to them from two directions of the main power supply line along two adjacent sides of the rectangular region, the equivalent wiring resistance of the sub-power supply lines is further reduced.

When the equivalent wiring resistances of the sub-power supply lines are reduced, the voltage drop on the sub-power supply lines is reduced in the operable state of the MOS logic circuit. Therefore, even if the subthreshold current is reduced, it is possible to prevent the operating speed of the MOS logic circuit from lowering. Moreover, it is possible to further reduce the power consumption of a semiconductor integrated circuit in the wait state.

When the main power supply line comprises a first main power supply line to which a first power supply voltage having a relatively high level is applied and a second main power supply line to which a second power supply voltage having a relatively low level is applied, the sub-power supply line connected to the source of a p-channel MOS transistor to be kept off in the MOS logic circuit in the above operation stop state is connected to the first main power supply line through the switching MOS transistor. Moreover, the sub-power supply line connected to the source of an n-channel MOS transistor to be kept off in the MOS logic circuit in the operation stop state is connected to the second main power supply line through the switching MOS transistor. The conductivity of carriers of a p-channel MOS transistor is approximately ⅓ the conductivity of carriers of an n-channel MOS transistor. Therefore, in the case of a CMOS circuit, the channel width of a p-channel MOS transistor is set to a value three times larger than the channel width of an n-channel MOS transistor. Thereby, the subthreshold current is produced by a p-channel MOS transistor more frequently than by an n-channel MOS transistor. Thus, when it is impossible to take a measure to reduce the subthreshold current for both n- and p-channel MOS transistors, it is expedient to take a measure for at least the p-channel MOS transistor.

A memory such as a DRAM frequently uses a voltage obtained by boosting a power supply voltage as a word line selection level in general. A MOS transistor constituting a MOS logic circuit using a boosted voltage as the operating voltage frequently uses a threshold voltage equal to that of a MOS transistor included in another circuit in order to simplify the fabrication process though the former has a high operating power supply voltage compared to the MOS transistors included in the other circuits. This is equivalent to the fact that the threshold voltage of a MOS transistor using a boosted voltage as the operation power supply lowers relatively to the operation power supply. This leads to the tendency to increase the subthreshold current. A semiconductor integrated circuit of the present invention considering the above point includes a plurality of memory mats including a large number of memory cells in which a word line is connected to a selection terminal and arranged like an array; a word driver for selectively driving word lines regularly arranged between the memory mats arranged like an array; a plurality of MOS logic circuits for supplying a word-line driving voltage to the word drivers regularly arranged between the memory mats arranged like an array; X-direction sub-power supply lines and Y-direction sub-power supply lines connected to power supply terminals of the MOS logic circuits, arranged in X and Y directions, and having a connection point at each intersection position; a main power supply wiring provided in the arrangement direction of at least one of the X- and Y-direction sub-power supply lines; and a plurality of switching MOS transistors for individually connecting all or part of the sub-power supply lines selected out of the X- and Y-direction sub-power supply lines to the main power supply-line; in which the switching MOS transistors are kept off in the standby state of the MOS logic circuits and kept on in the operable state of the MOS logic circuits. A boosted voltage is supplied to the main power supply line. The operation stop state is designated correspondingly to, for example, the chip non-selected state.

When a boosted voltage is supplied to the main power supply line, a source is connected to the sub-power supply line, and, thus, it is possible to supply the boosted voltage to the well region of a p-channel MOS transistor in the MOS logic circuit. Thereby, the threshold voltage of the p-channel MOS transistor tends to be raised, and, also, the subthreshold current is reduced.

A selection signal is received by a group of word drivers from a common main word line, and the MOS logic circuit supplies the word line driving level of the sub-power supply line to the word drivers in accordance with a decoding signal for selecting one word driver out of the word drivers. Because the main word line is provided for each group of a plurality of word drivers, the intervals between main word lines are relatively wide, and the sub-power supply lines are provided between the main word lines. That is, the sub-power supply lines are formed in the same wiring layer as the main word lines. Thereby, the chip area is not increased even if the number of sub-power supply lines increases.

DETAILED DESCRIPTION OF THE INVENTION

Figure 1:
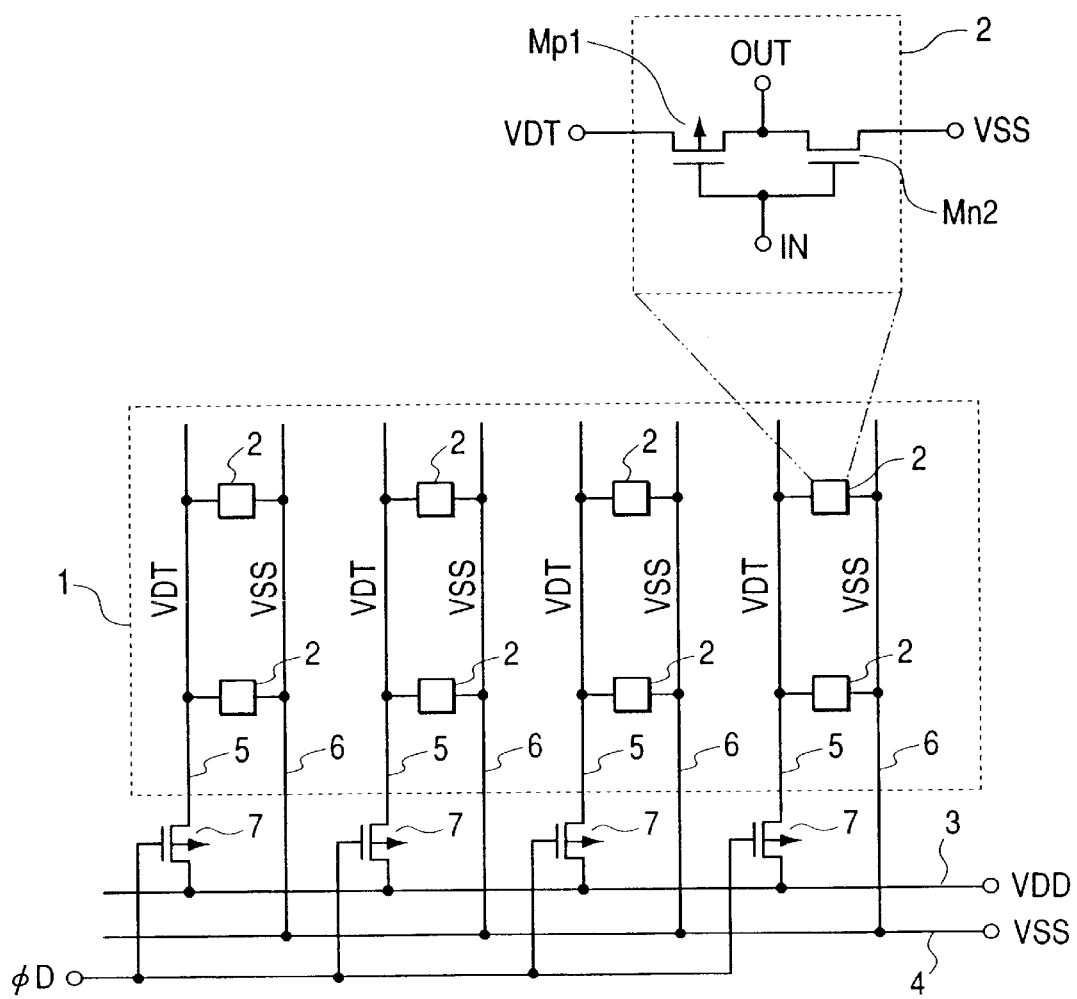
FIG. 1 is a circuit diagram showing an SCRC for reducing the subthreshold current of a semiconductor integrated circuit.

FIG. 1 shows an SCRC for reducing the subthreshold current of a semiconductor integrated circuit. The circuit shown in FIG. 1 is a part of a semiconductor integrated circuit whose operating voltage is lowered to 1.5 to 2 V, like a DRAM of 256 Mbit to 1 Gbit or more, from the viewpoints of the withstand voltage of elements microminiaturized for further integration and speed-up of the operation. In FIG. 1, the rectangular region designated by numeral 1 is a region in which a MOS logic circuit 2, notable as an object whose subthreshold current must be reduced, is provided. Though other circuit elements are also actually arranged in this rectangular region 1, they are not illustrated.

In this case, the MOS logic circuit 2, though not restricted, uses a CMOS inverter having a p-channel MOS transistor Mp1 and an n-channel MOS transistor Mn2. Hereafter; the MOS logic circuit 2 is also referred to as a CMOS inverter 2. In the case of the CMOS inverter 2, an input signal IN is fixed to a high level in the wait state or standby state, and, thereby, the state of a circuit for receiving the output of the CMOS inverter is fixed. The CMOS inverters 2 are arranged in the rectangular region 1 like a matrix.

X-direction main power supply lines 3 and 4 are arranged along a long side of the rectangular region 1. A power supply voltage VDD having a relatively high level of, e.g., 2 V is supplied to the X-direction main power supply line (first X-direction main power supply line) 3 and a ground voltage VSS having a relatively low level of, e.g., 0 V is supplied to the X-direction main power supply line (second X-direction main power supply line) 4. A plurality of sub-power supply lines 5 and 6 are arranged on the rectangular region 1 in the direction crossing the main power supply lines 3 and 4. One sub-power supply line (first Y-direction sub-power supply line) 5 is connected to the main power supply line 3 through a p-channel switching MOS transistor and the other sub-power supply line (second Y-direction sub-power supply line) 6 is directly connected to the main power supply line 4. The switching MOS transistors 7 are turned on/off by a control signal $\phi$D.

The CMOS inverters 2 obtain their operating power from the sub-power supply lines 5, 6. The voltage supplied to the sub-power supply lines 5 will be referred to as a voltage VDT in order to distinguish the voltage from the power supply voltage VDD. The switching MOS transistors 7 are kept on in the operation state of the semiconductor integrated circuit. Thereby, the voltage VDT of the sub-power supply line 5 is made almost equal to the power supply voltage VDD. Thereby, the CMOS inverters 2 are operated by using the power supply constituted of the power supply voltage VDD and the ground voltage VSS.

The input IN of each CMOS inverter 2 is fixed to a high level almost equal to the power supply voltage VDD in the standby state of the semiconductor integrated circuit. In this case, the signal $\phi$D is also set to a high level and the switching MOS transistor 7 is kept off. Then, the voltage VDT of the sub-power supply lines 5 is made lower than the power supply voltage VDD of the main power supply line 3. Thereby, the source voltage of the p-channel MOS transistor Mp1 constituting the CMOS inverter 2 is brought into a reverse bias voltage lower than the gate voltage of the transistor Mp1, and thus it is possible to prevent a subthreshold current from being produced or to reduce the current. When the semiconductor integrated circuit is changed from the standby state to the operable state, the control signal $\phi$D is brought to the low level synchronously with the change of the state of the semiconductor integrated circuit.

Figure 16:
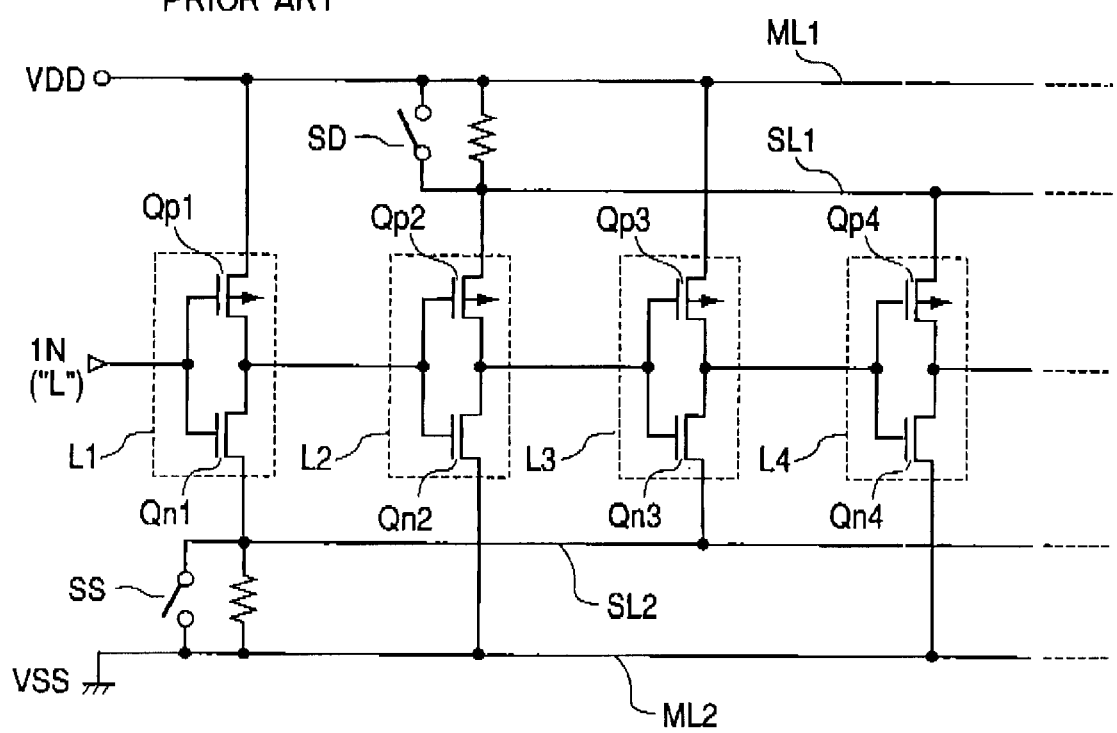
FIG. 16 is a circuit diagram of an SCRC previously studied by the present inventor.

In the case of the structure of the SCRC, switching MOS transistors 7 are dispersedly arranged for the main power supply lines 3 and 4. As shown in FIG. 16, it is possible to decrease the equivalent wiring resistances of the sub-power supply lines 5 and 6 compared to the case where switching MOS transistors are concentratedly provided at one place as shown in FIG. 16. This is because the distance between each CMOS inverter 2 and the nearest switching MOS transistor 7 is decreased. As shown in FIG. 1, because the sub-power supply lines 5 and 6 are arranged in the direction of the short side of the rectangular region 1, the length of each of the sub-power supply lines 5 and 6 becomes equal to or less than the length of the short side of the rectangular region 1 and the resistance value of each of the sub-power supply lines 5 and 6 is further decreased. Moreover, it is possible to reduce the parasitic capacitance components of the sub-power supply lines 5 and 6.

Thus, when the equivalent resistances of the sub-power supply lines 5 and 6 are reduced, it is possible to reduce failures such that the voltage VDT undesirably lowers from the power supply voltage VDD on the sub-power supply lines 5 or the voltage of the sub-power supply lines 6 undesirably rises from the ground voltage VSS in the operable state of the CMOS inverters 2. Therefore, even if the subthreshold current is reduced, it is possible to prevent the operating speed of the CMOS inverters 2 from lowering in the operating state of the semiconductor integrated circuit. Moreover, because the parasitic capacitance components (wiring capacitance components) of the sub-power supply lines 5 and 6 are reduced, it is possible to shorten the time required for the voltage VDT of the sub-power supply line 5 to recover to the power supply voltage VDD when the switching MOS transistor 7 is turned on. Therefore, it is also possible to reduce the transition time from the wait state to the operable state of the semiconductor integrated circuit. Thus, because a subthreshold current can be prevented from being produced by means of the CMOS inverter 2 or reduced, it is possible to control unnecessary power consumption of the semiconductor integrated circuit during the wait time.

Figure 2:
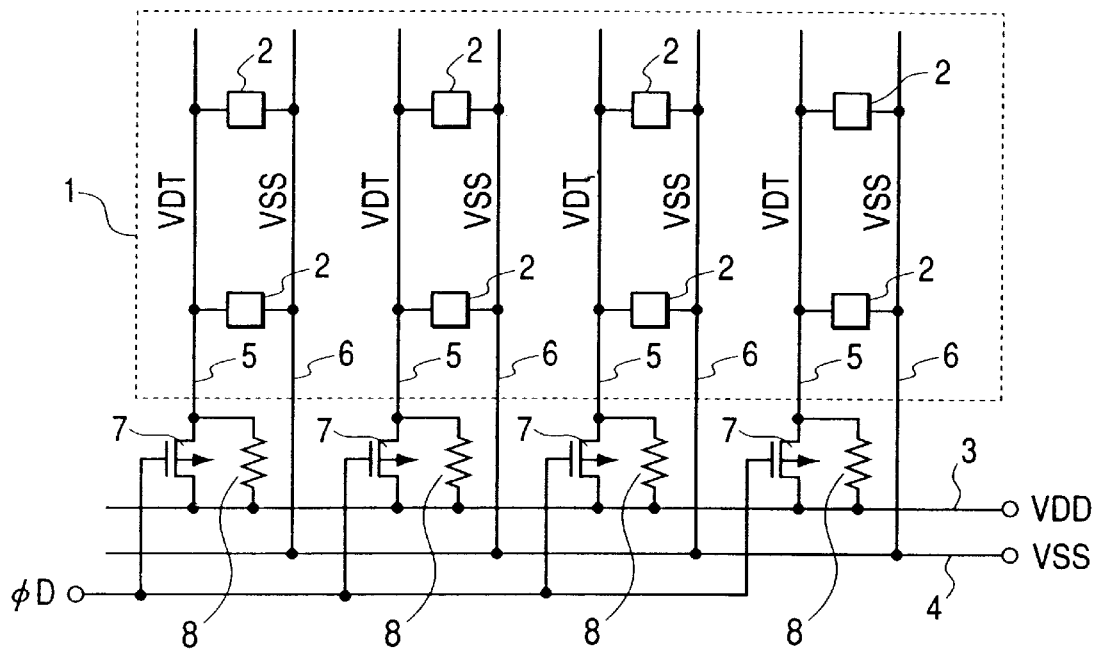
FIG. 2 is a circuit diagram constituted by adding a structure for relatively reducing the lowering of the level of a sub-power supply line in the wait state to the structure of FIG. 1.

In the case of the structure of FIG. 1, the leakage current of the MOS transistor 7 is supplied to the sub-power supply line 5 from the main power supply line 3 while the switching MOS transistor 7 is off. Therefore, the level of the sub-power supply line 5 is not abnormally lowered. When the level of a sub-power supply line is excessively lowered, the time taken for the voltage VDT of the sub-power supply line 5 to return to the power supply voltage VDD is increased. To relatively reduce the lowering of the level of the sub-power supply line 5 in the wait state of the semiconductor integrated circuit, it is possible to connect a high-resistance element to the switching MOS transistor 7 in parallel, as shown in FIG. 2.

Figure 3:
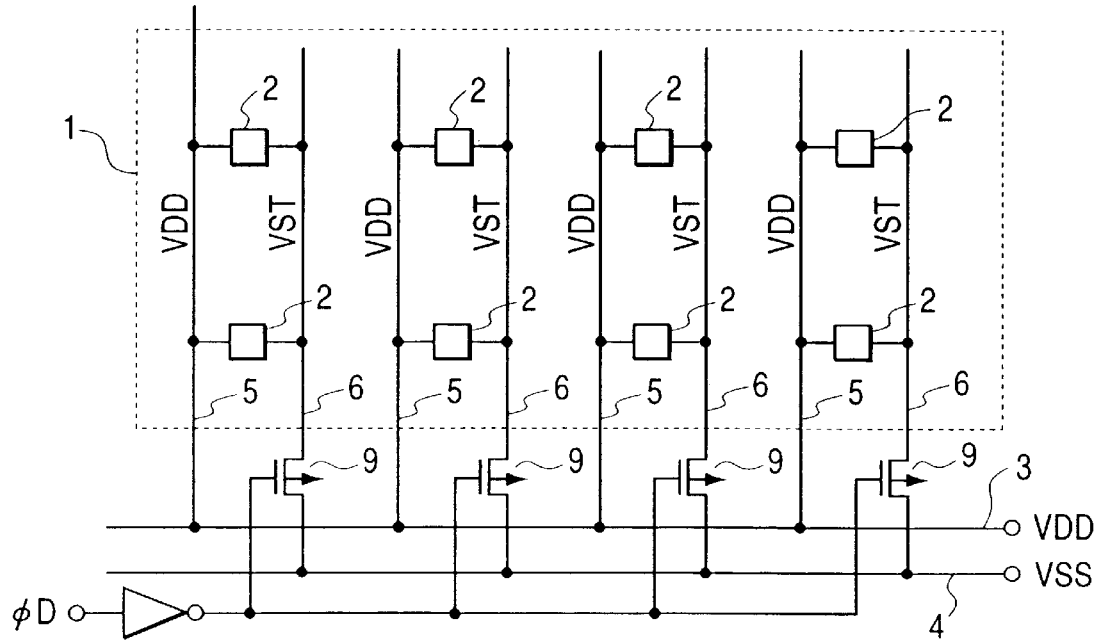
FIG. 3 is a circuit diagram showing an SCRC constituted by providing an n-channel switching MOS transistor between a sub-power supply line and a main power supply line on the ground voltage side.

FIG. 3 shows an example in which n-channel MOS transistors 9 are provided between the sub-power supply lines 6 and the main power supply line 4 on the ground voltage VSS side. In this example, the input IN of the CMOS inverter 2 is fixed to the low level in the standby state of the semiconductor integrated circuit. Thereby, the switching MOS transistor 9 is kept off in the standby state and the level of the voltage VST of the sub-power supply line 6 is made higher than the ground voltage VSS. As a result, the n-channel MOS transistor Mn2 constituting each CMOS inverter 2 is brought into a reverse bias voltage state in which the source voltage of the MOS transistor Mn2 is made higher than the gate voltage of the transistor Mn2, and thereby it is possible to prevent the subthreshold current of the MOS transistor Mn2 from being produced or to reduce the current. The advantage obtained from the layout of the main power supply lines 3 and 4 and the sub-power supply lines 5 and 6 is the same as the case of FIG. 1.

Figure 4:
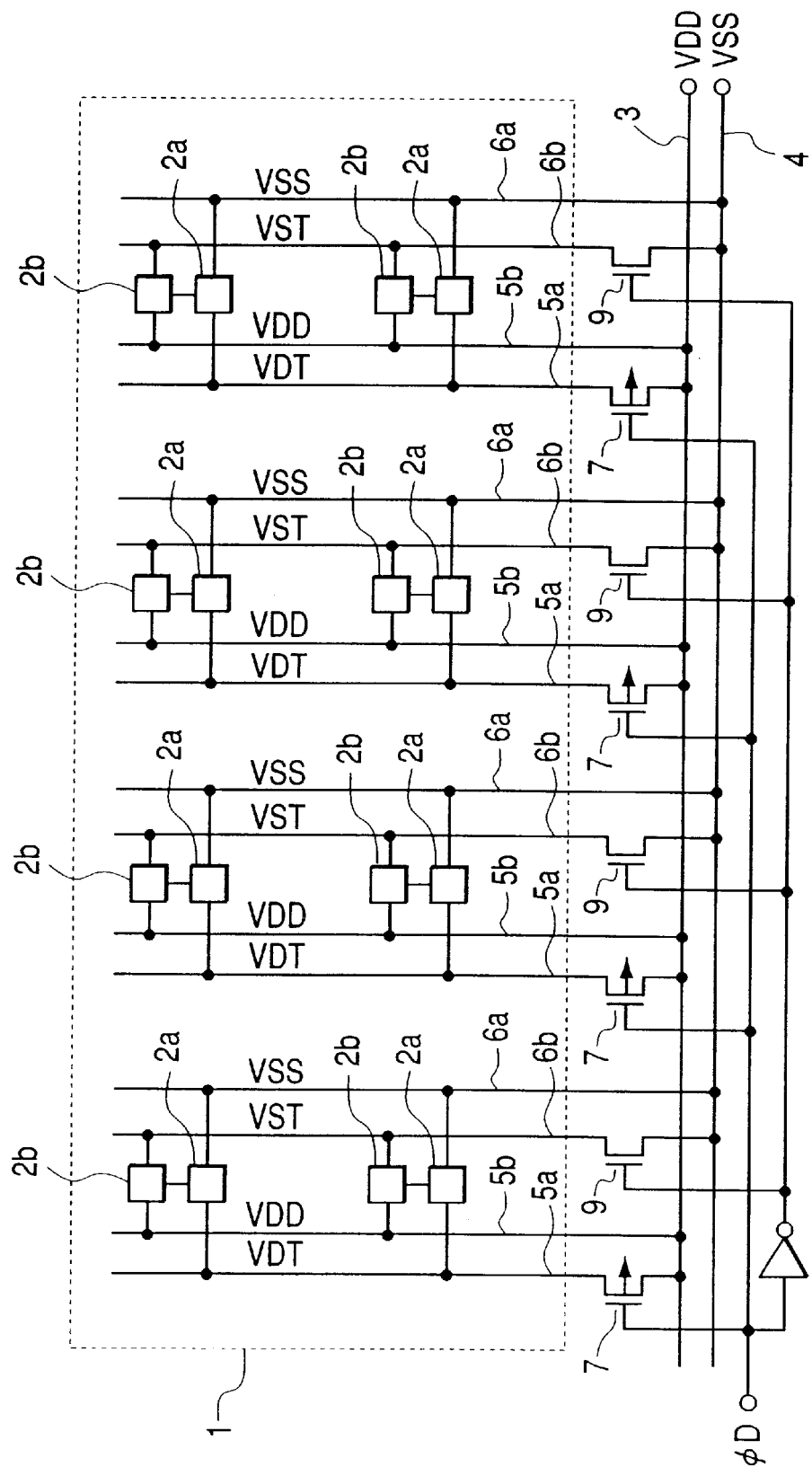
FIG. 4 is a circuit diagram showing an SCRC constituted by using a series circuit of two CMOS inverters as a MOS logic circuit whose sub-threshold current must be reduced in the standby state.

FIG. 4 shows a case in which a MOS logic circuit whose subthreshold current in the standby state must be reduced is a series circuit constituted of two CMOS inverters 2a and 2b. The structure of FIG. 4 is a circuit structure obtained by combining the structure of FIG. 1 with the structure of FIG. 3. That is, sub-power supply lines 5a and 5b arranged perpendicularly to the main power supply line 3, and sub-power supply lines 6a and 6b are arranged perpendicularly to the main power supply line 4. One sub-power supply line 5a on the power supply voltage VDD side is connected to the main power supply line 3 through the switching MOS transistor 7 and the other sub-power supply line 5b is directly connected to the main power supply line 3. One sub-power supply line 6a on the ground voltage VSS side is directly connected to the main power supply line 4 and the other sub-power supply line 6b is connected to the main power supply line 4 through the switching MOS transistor 9. A CMOS inverter 2a of the first stage is operated by using the voltages VDT and VSS of the sub-power supply lines 5a and 6a as its operating power supply. A CMOS inverter 2b of the second stage is operated by using the voltages VDD and VST as its operating power supply. Therefore, subthreshold currents of the p-channel MOS transistor Mp1 of the CMOS inverter 2a and the n-channel MOS transistor Mn2 of the CMOS inverter 2b are suppressed in the standby state of the semiconductor integrated circuit.

Figure 5:
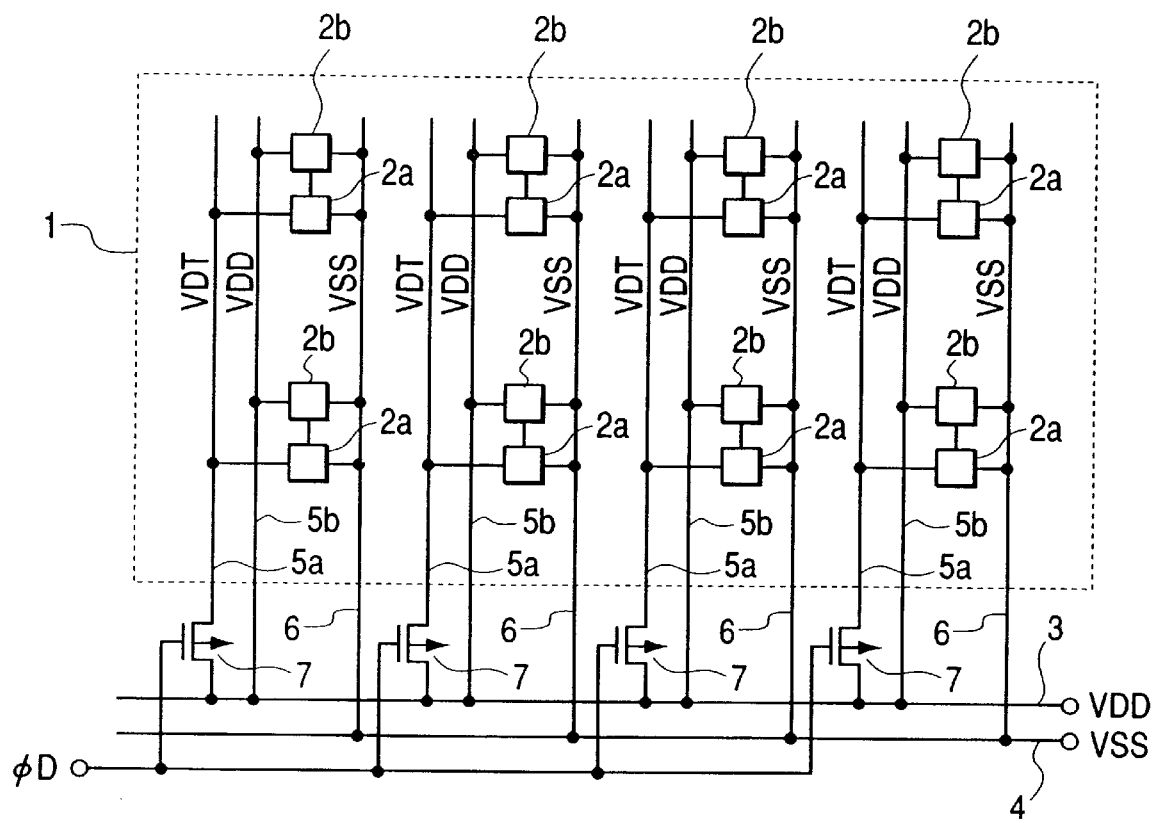
FIG. 5 is a circuit diagram of an SCRC in which the number of sub-power supply lines on the ground voltage side of FIG. 4 is decreased.

FIG. 5 shows a case where the sub-power supply lines 6a and 6b on the ground voltage VSS side of FIG. 4 are united into one wiring. That is, the sub-power supply lines 6b and switching. MOS transistors 9 of FIG. 4 are omitted, and the n-channel MOS transistors Mn2 of the CMOS inverters 2b on the second stage are combined with the sub-power supply lines 6b. In the case of this structure, reduction of the subthreshold currents of the n-channel MOS transistors Mn2 of the CMOS inverters 2b of the second stage is not sought. In this case, the conductivity of carriers of a p-channel MOS transistor is approximately ⅓ the conductivity of carriers of an n-channel MOS transistor. Therefore, in the case of a CMOS circuit, the channel width of the p-channel MOS transistor is set to a value three times larger than that of the n-channel MOS transistor. Thereby, a subthreshold current is produced by the p-channel MOS transistor more frequently than by the n-channel MOS transistor. Therefore, as shown in FIG. 5, by taking a measure for reducing the subthreshold current only of the p-channel MOS transistor Mp1 of the CMOS inverter 2a of the first stage, it is possible to reduce the power consumption in the wait state to a certain extent.

Though the structure of FIG. 5 is inferior to the structure in FIG. 4 in terms of lowering of the power consumption in the wait state, the circuit structure or chip occupation area is reduced compared to the case of FIG. 4.

Figure 6:
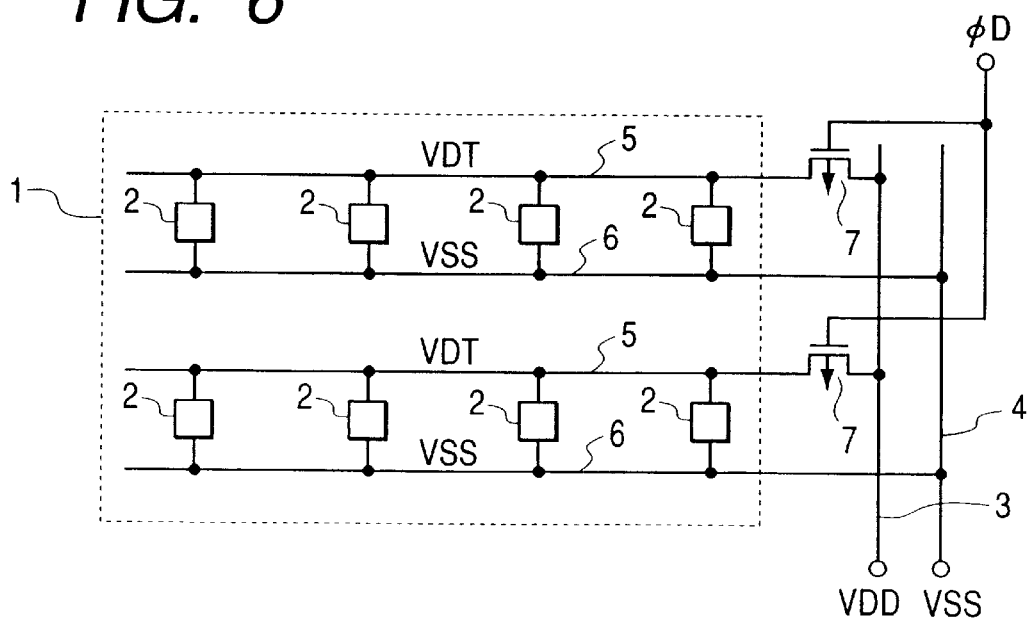
FIG. 6 is a circuit diagram of an SCRC in which a main power supply-line is provided along a long side of a rectangular region.

FIG. 6 shows a case where main power supply lines are arranged along one short side of a rectangular region. In this case, the sub-power supply lines 5 and 6 are arranged in the long-side direction of the rectangular region 1. Though the sub-power supply lines 5 and 6 are long compared to the case of the structure in FIG. 1, the main power supply lines 3 and 4 are short. Because the main power supply lines 3 and 4 are short, it is possible to save the areas for the lines 3 and 4 occupying wiring regions compared to the case of FIG. 1. However, an undesirable voltage drop on the sub-power supply lines 5 and 6 increases in the case of FIG. 4 compared to the case of FIG. 1.

Figure 7:
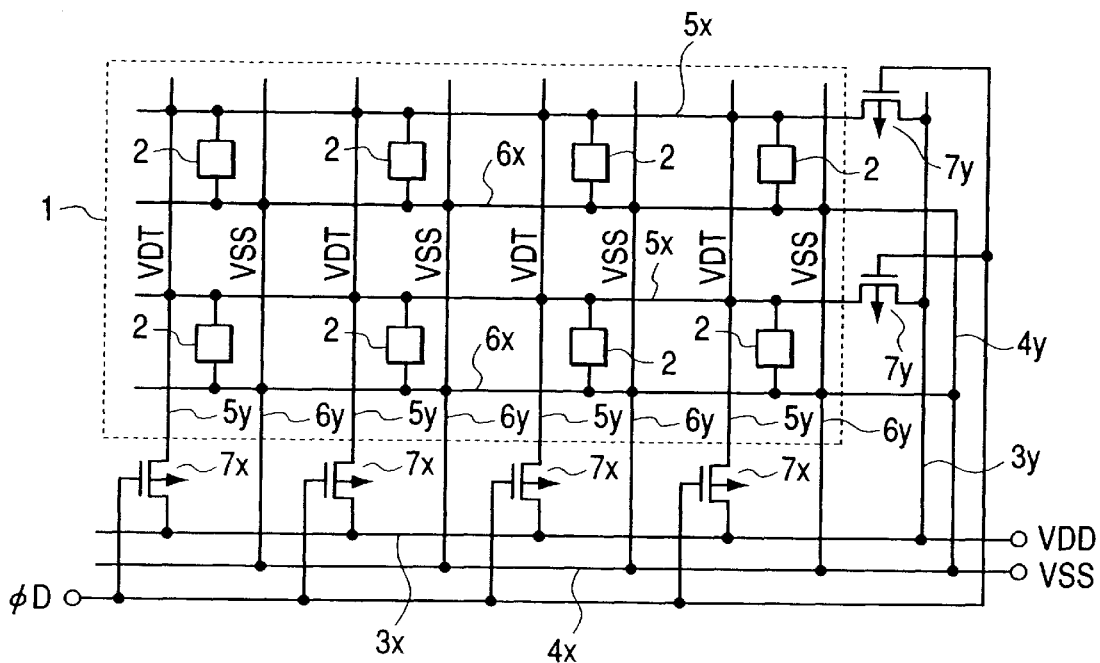
FIG. 7 is a circuit diagram of an SCRC in which sub-power supply lines are arranged like a mesh.

FIG. 7 shows a case where sub-power supply lines are arranged like a mesh. In the case of a CMOS inverter 2 shown in FIG. 7, the input IN is fixed to a high level in the wait state of the semiconductor integrated circuit similarly to the case of FIG. 1.

X-direction main power supply lines 3x and 4x and Y-direction main power supply lines 3y and 4y are arranged along two adjacent sides of the rectangular region 1. The main power supply lines 3x and 3y are connected to each other and the power supply voltage VDD is supplied to them. Moreover, the main power supply lines 4x and 4y are connected to each other and the ground voltage VSS is supplied to them.

A plurality of X-direction sub-power supply lines 5x and 6x are alternately arranged in the X direction at certain intervals and a plurality of Y-direction sub-power supply lines 5y and 6y are arranged in the Y direction at certain intervals in the rectangular region 1. The X-direction sub-power supply lines 5x and the Y-direction sub-power supply lines 5y are connected at intersection positions, and, similarly, the X-direction sub-power supply lines 6x and the Y-direction sub-power supply lines 6y are connected at intersection positions. The p-channel MOS transistor Mp1 and n-channel MOS transistor Mn2 of the CMOS converter 2 serving as the MOS logic circuit are directly connected to the X-direction sub-power supply lines 5x and 6x. The X-direction sub-power supply lines 5x are connected to the Y-direction main power supply wiring 3y through p-channel switching MOS transistors 7y provided in the Y direction, and the Y-direction sub-power supply lines 5y are connected to the X-direction main power supply line 3x through p-channel MOS transistors 7x provided in the X direction. The main power supply lines 4x and 4y on the ground voltage VSS side are directly connected to the sub-power supply lines 6y and 6x.

The switching MOS transistors 7x and 7y are switching-controlled by the control signal 4D, kept off in the wait state of the semiconductor integrated circuit, and kept on in the operable state of the semiconductor integrated circuit.

In the case of the above structure, there are two layout modes of the sub-power supply lines 5x, 5y, 6x, and 6y. The first mode is a technique of using one wiring layer (e.g. the metal wiring layer of the third layer) for the sub-power supply lines 5x and 5y on the power supply voltage side and using another wiring layer (e.g. the second metal wiring layer) for the sub-power supply lines 6x and 6y on the ground voltage side. The second mode is a method of using a wiring layer (e.g. the metal wiring layer of the third layer) for the Y-direction (longitudinal direction) sub-power supply lines 5y and 6y and using another wiring layer (e.g. the second metal wiring layer) for the X-direction (lateral direction) sub-power supply lines 5x and 6x. In the case of the latter, through-holes are provided in the intersections between the sub-power supply lines 5x and 5y and the intersections between the sub-power supply lines 6x and 6y to connect the lines to each other.

In the case of the above example, because electric power is supplied to the sub-power supply lines 5x and 5y connected to each other at intersection positions from two directions through the switching MOS transistors 7x and 7y, it is possible to decrease the equivalent resistance component and capacitance component of the sub-power supply lines 5x and 5y compared to the case of the structure of FIG. 1. Therefore, it is possible to further increase the speed of the operation of the CMOS inverter 2 in the operable state and further decrease the time for the transition from the wait state to the operable state.

Other functions and advantages are the same as the case of FIG. 1. Therefore, their detailed description will be omitted.

Figure 8:
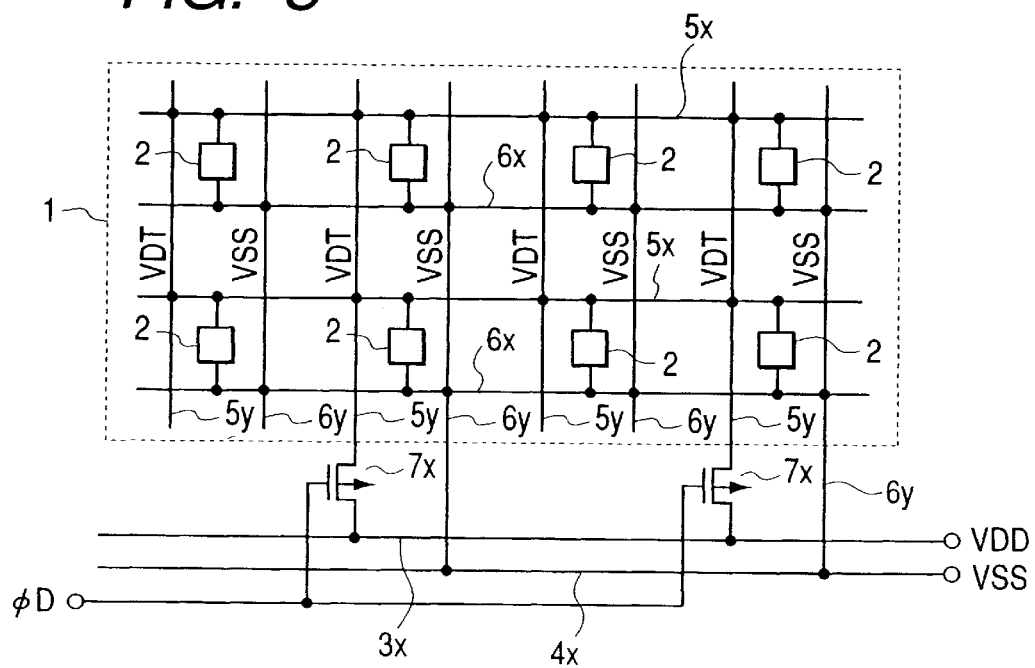
FIG. 8 is a circuit diagram showing a structure obtained by simplifying the structure of FIG. 7 in accordance with the restriction on the layout.

FIG. 8 shows a structure obtained by simplifying the structure of FIG. 7 in accordance with the restriction on the layout. As shown in FIG. 7, it is ideal to provide switching MOS transistors 7x and 7y for every sub-power supply line 5x and 5y. However, when the switching MOS transistors cannot be provided for every sub-power supply line 5x and 5y due to the restriction on the layout, it is possible to omit a part of the structure of FIG. 7. For example, as shown in FIG. 8, the main power supply lines 3x and 4x are provided only in one direction and the switching MOS transistor 7x is provided for every other sub-power supply line 5y. In this case, sub-power supply lines 5x, 6x, 5y, and 6y are arranged like a mesh as described before, similarly to the case of FIG. 7. Because the sub-power supply lines 5x, 6x, 5y, and 6y are laid out like a mesh, many paths for supplying current to the CMOS inverters 2 are secured even if the number of switching MOS transistors 7x is small. Thereby, equivalent resistance components and capacitance components of the sub-power supply lines do not greatly increase compared to the case of the structure of FIG. 1.

Figure 9:
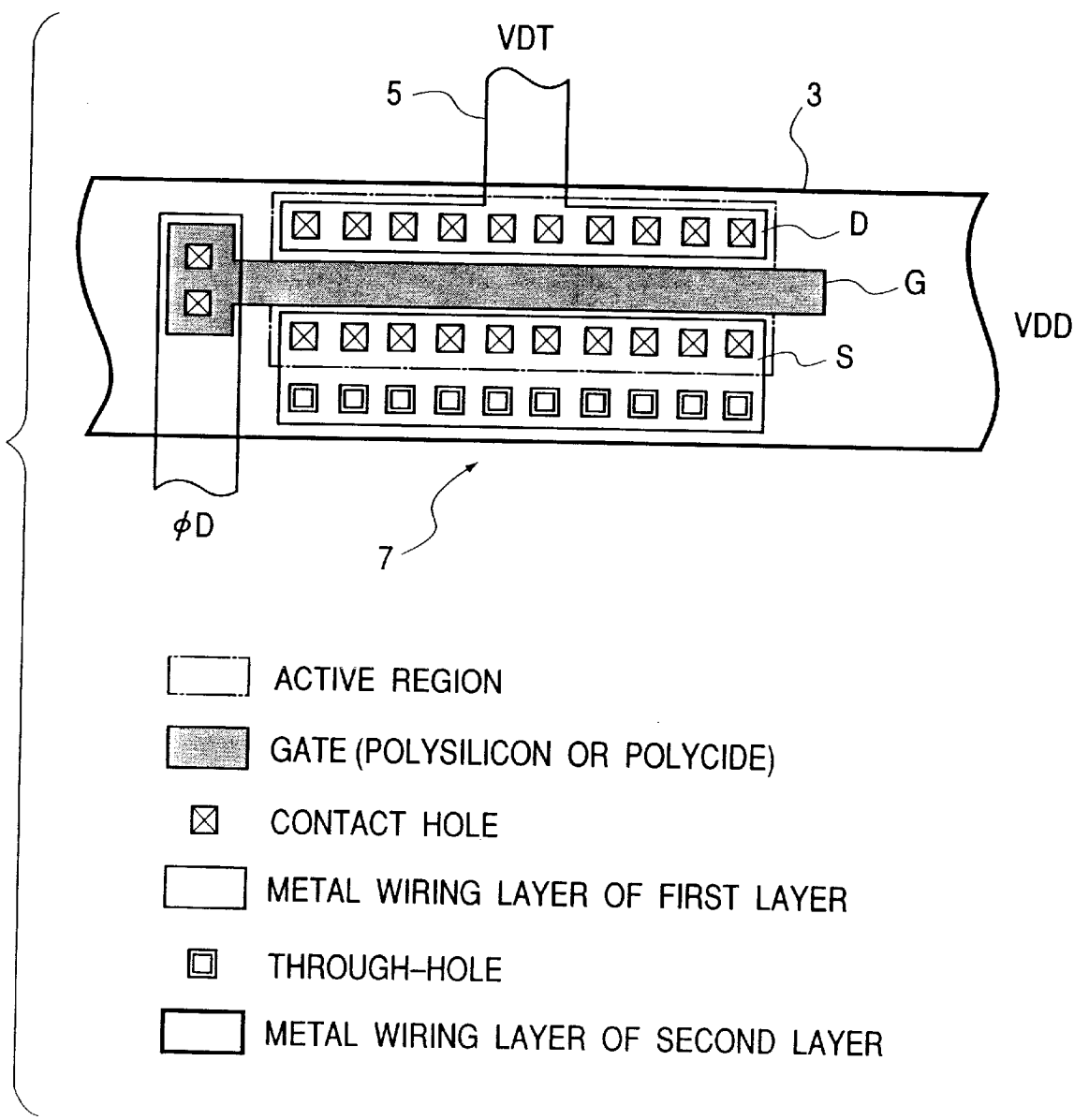
FIG. 9 is a top view showing a layout of a switching MOS transistor.

FIG. 9 shows a layout of the switching MOS transistors 7. The switching MOS transistors 7 are formed in a region immediately below a main power supply line 3. For the switching MOS transistors 7, symbol S denotes the sources, D denotes the drains, and G denotes the gates.

Thus, by forming the switching MOS transistors 7 immediately below the main power supply line 3, it is possible to save on the amount of chip area required. In other words, it is possible to provide the switching MOS transistors 7 having a relative large size without increasing the chip area. Moreover, it is possible to similarly constitute the arrangement of the switching MOS transistors 7x for the main power supply line 3x and the arrangement of the switching MOS transistors 7y for the main power supply line 3y.

Figure 10:
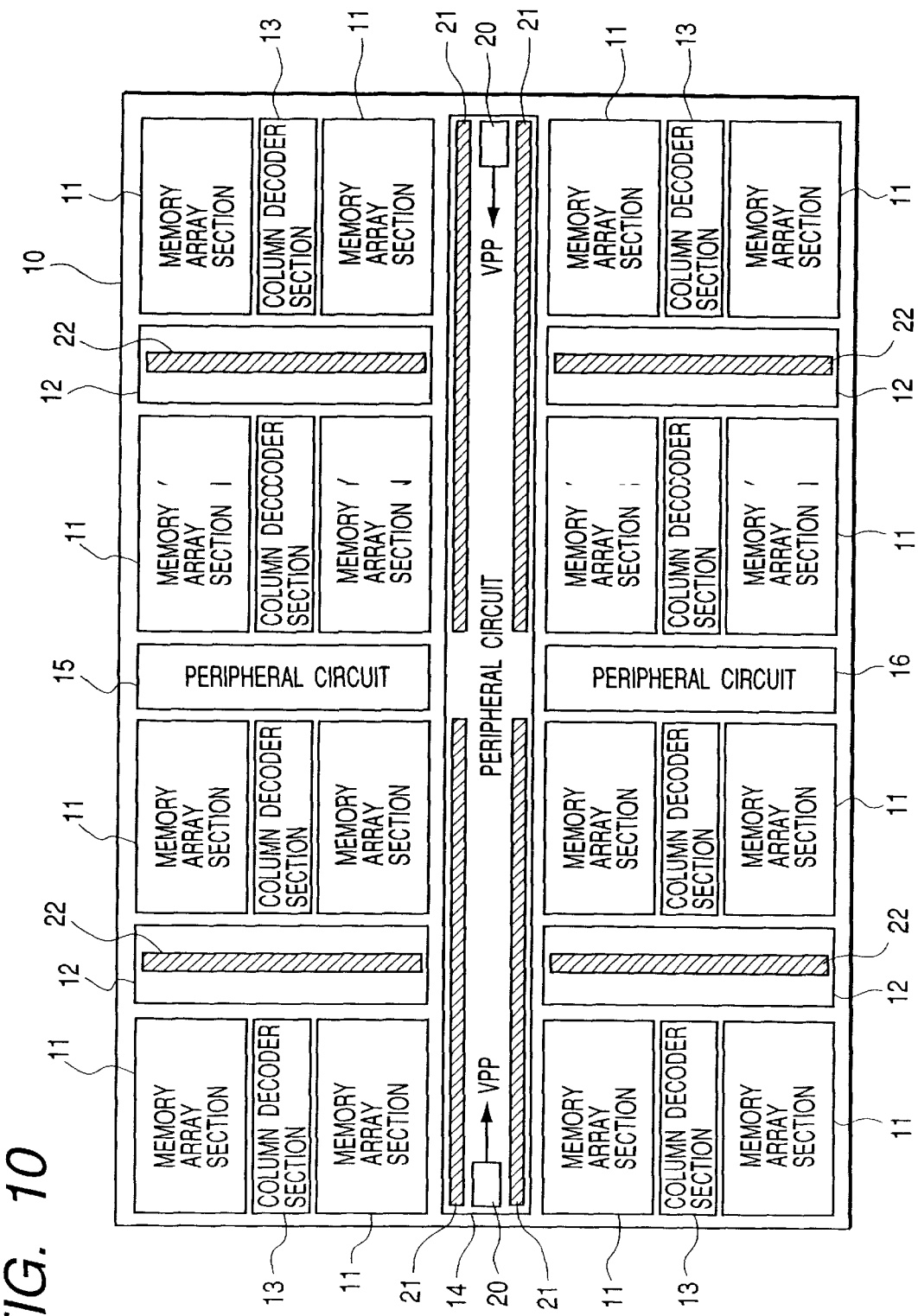
FIG. 10 is an overall block diagram of a DRAM to which the structure of an SCRC of the present invention is applied.

FIG. 10 shows an overall block diagram of a DRAM to which the present invention is applied. The DRAM of FIG. 10 is formed on one semiconductor substrate 10 made of, for example, single crystal silicon. The circuit block arrangement shown in FIG. 10 conforms to a layout example of the DRAM. A peripheral circuit 14 is provided in the central portion of the semiconductor substrate 10 and many memory array sections ii, column decoder sections 13, row decoder sections 12, and peripheral circuit sections 15 and 16 are arranged on and below the peripheral circuit 14.

Many dynamic memory cells are arranged in each memory array section 11. Each of the row decoder sections decodes a row address signal and generates a selection signal for selecting a word line connected to the selection terminal of a memory cell. Each of the column decoder sections 13 decodes a column address signal and selects a bit line connected to the data input/output terminal of the memory cell. The peripheral circuit sections 14, 15, and 16 respectively include an address input buffer, data input/output buffer, and timing controller to perform the general control of a DRAM.

In this DRAM, circuits to which the above SCRC for reducing the subthreshold current is applied are arranged in the memory array sections 11. In this example, the high-potential-side power supply of a circuit to which the SCRC is applied uses a boosted voltage VPP for driving a word line. The boosted voltage VPP is generated by boosting an external power supply voltage corresponding to the power supply voltage VDD with a boosting circuit 20. The boosting circuit 20 is provided in the peripheral circuit section 14. The main power supply line to which the boosted voltage VPP is supplied and switching MOS transistors for the SCRC are formed in hatched regions 21 and 22 shown in the row decoder circuit sections 12 and peripheral circuit section 14 of FIG. 10. The sub-power supply lines are arranged like a mesh on the upper layer of the memory array section 11. These structures will be described later in detail.

The arrangement of main power supply lines and switching MOS transistors is not restricted to the above case. By arranging main power supply lines and switching MOS transistors in the peripheral circuit sections 15 and 16, in the column decoder sections 13, 15 or on the peripheral parts of the semiconductor substrate 10, it is possible to supply power to mesh-like sub-power supply lines from four directions and further reduce the equivalent resistance component and equivalent capacitance component of the sub-power supply lines.

Figure 11:
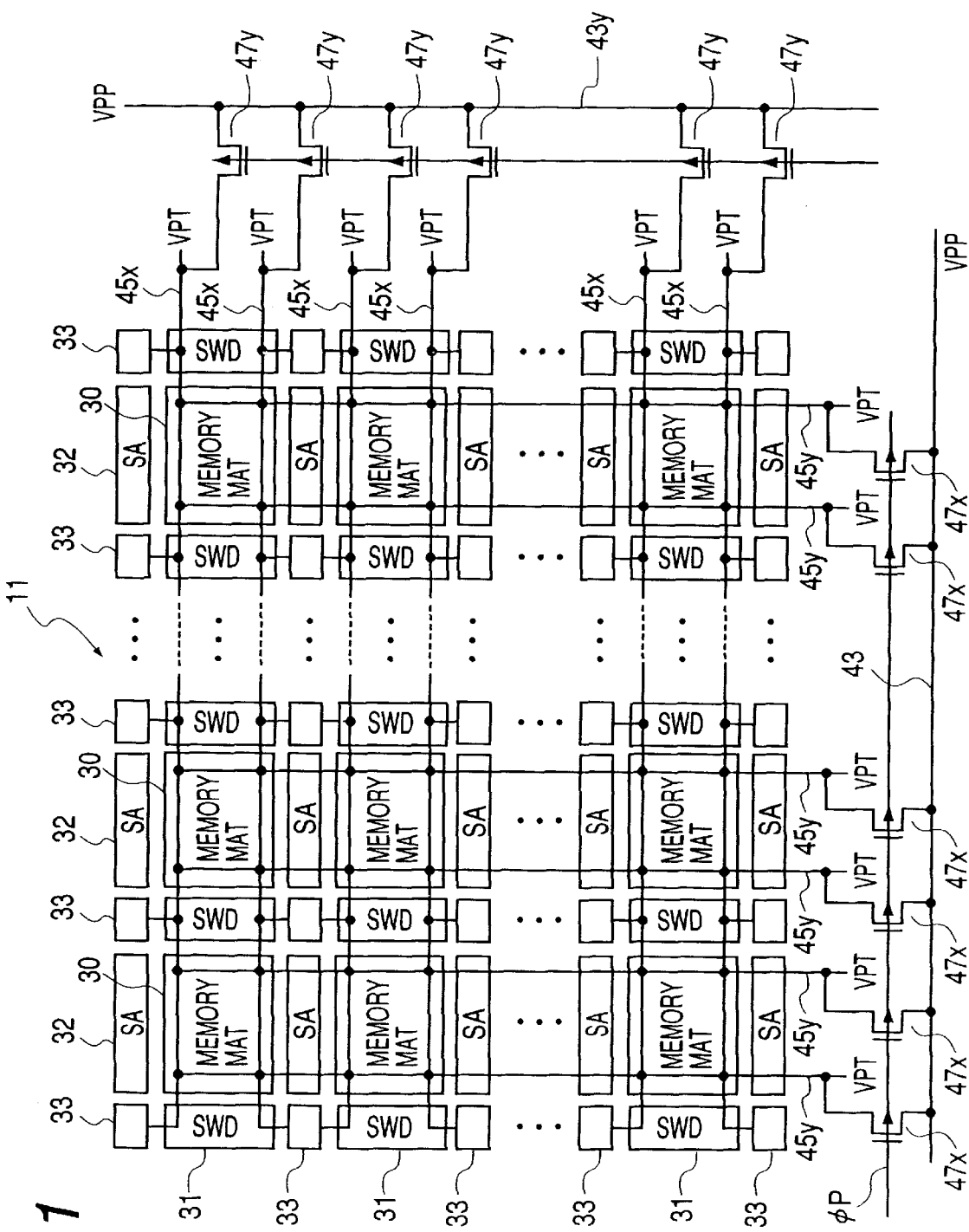
FIG. 11 is a block diagram showing a memory array section included in the DRAM of FIG. 10.

FIG. 11 shows an example of a memory array section 11. In the memory array section 11, many memory mats 30, sense amplifier sections (SA) 32, sub-word driver sections (SWD) 31, and MOS logic circuits 33 are regularly arranged like an array. The MOS logic circuits 33 supply the boosted voltage VPP as a driving voltage to the sub-word driver sections 31.

Many dynamic memory cells are arranged in a memory mat 30 like a matrix. Each sense amplifier section 32 includes many sense amplifiers each connected to a pair of complementary bit lines connected to the data input/output terminal of a memory cell by the folded bit line method. Each sub-word driver section 31 includes many sub-word drivers for selectively driving a sub-word line connected to the selection terminal of a memory cell to a selection level.

Though the structures of the sub-word driver section 31 and MOS logic circuits 33 will be described later in detail, the selection level to be output to a sub-word line from a sub-word driver section 31 is supplied through the MOS logic circuit 33 and is equal to the boosted voltage VPP. The threshold voltage of a MOS transistor constituting the MOS logic circuit 33 is made equal to the threshold voltage of the other MOS transistors of the memory array section 11. Therefore, the level of the high-potential-side power supply voltage (boosted voltage VPP) of the MOS logic circuit 33 is made higher than the level of the other MOS transistors of the memory array section 11. In other words, the threshold voltage of a MOS transistor constituting the MOS logic circuit 33 with respect to the power supply voltage is made relatively lower than those of the other MOS transistors of the memory array section 11. Moreover, the number of the MOS logic circuits 33 accounts for the major part of circuits including MOS transistors connected to the power supply.

Considering the above condition, a CMOS inverter included in the MOS logic circuit 33 is assumed as an object of an SCRC in the case of this example. In the standby or chip non-selected state of the DRAM of FIG. 11, the input of a CMOS inverter included in the MOS logic circuit 33 is fixed to a high level (the p-channel MOS transistor of the CMOS inverter is kept off). That is, the SCRC structure to the CMOS inverter included in the MOS logic circuit 33 is applied to the high-potential-side power supply. The structure of FIG. 7 is used for the operating power supply to the CMOS inverter included in the MOS logic circuit 33 of FIG. 11. FIG. 11 typically shows only the high-potential-side power supply path for the CMOS inverter included in the MOS logic circuit 33.

In FIG. 11, the memory array section 11 is used as a rectangular region, symbol 43x denotes an X-direction main power supply line provided in the X direction of the memory array section 11, 43y denotes a Y-direction main power supply line provided in the y direction of the section 11, and the boosted voltage VPP output from the boosting circuit 20 is supplied to the main power supply lines 43x and 43y. Symbol 45y denotes a Y-direction sub-power supply line provided in the Y direction on the memory array section 11 and 45x denotes an X-direction sub-power supply line provided in the X direction on the section 11. The X-direction sub-power supply lines 45x and the Y-direction sub-power supply lines 45y are connected to each other at intersection positions. The X-direction sub-power supply lines 45x are connected to the main power supply line 43y through switching MOS transistors 47y and the Y-direction sub-power supply lines 45y are connected to main power supply line 43x through switching MOS transistors 47x. The switching MOS transistors 47x and 47y are off in the standby state of the DRAM. Symbol VPT denotes the voltage of the sub-power supply lines 45x and 45y. Therefore, the voltage VPT is made lower than the boosted voltage VPP in the standby state of the DRAM. The voltage VPT is made equal to the boosted voltage VPP in the operating state of the DRAM. Because basic functions and advantages of the SCRC structure using the mesh-like sub-power supply lines are the same as the contents described referring to FIG. 7, their detailed description will be omitted.

Figure 12:
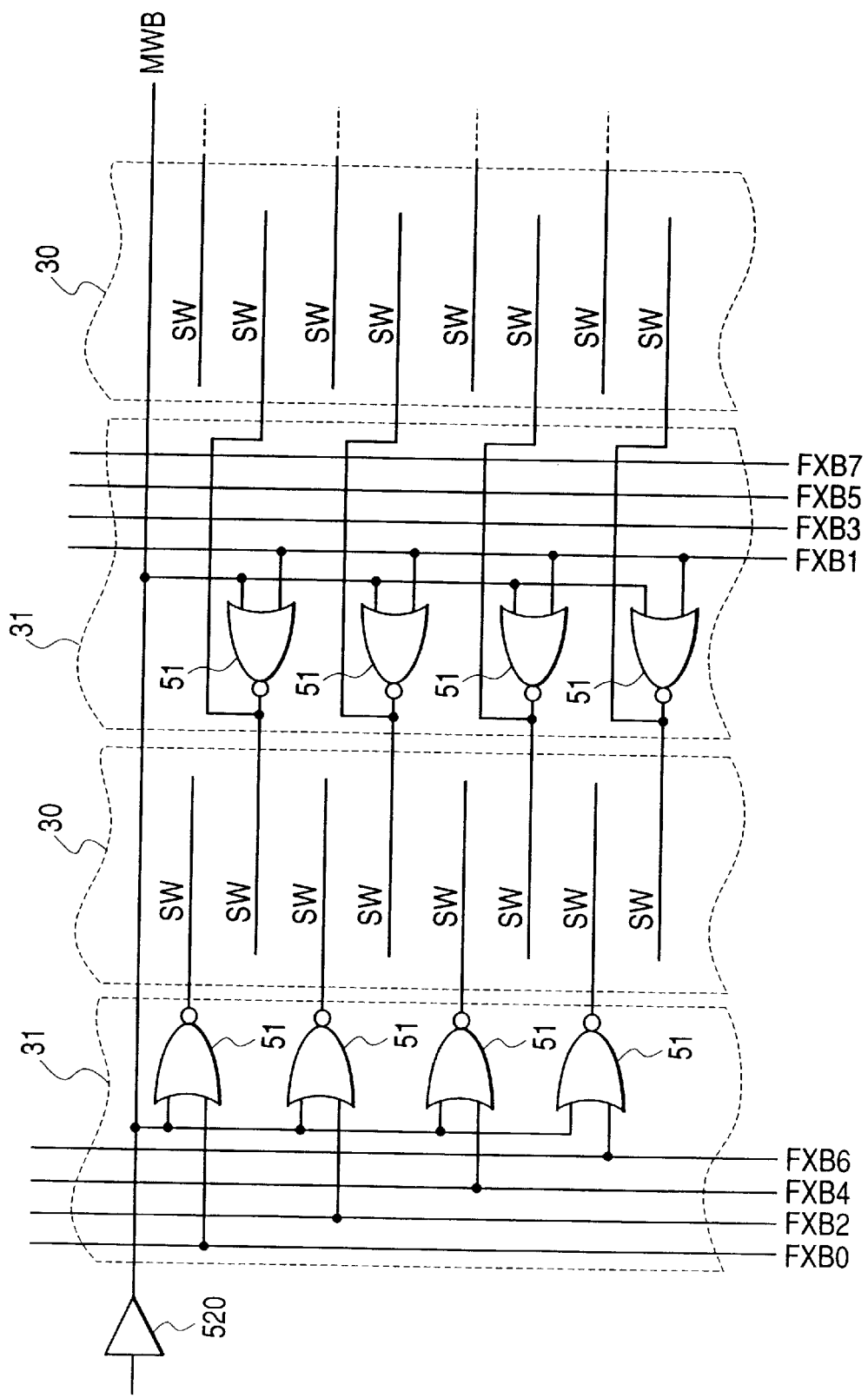
FIG. 12 is a logic circuit diagram showing a main- and sub-word line structure in the DRAM of FIG. 10.

FIG. 12 shows a circuit having the main- and auxiliary-word line structure of a DRAM. Symbol MWB denotes a main word line and SW denotes a sub-word line. The main word line MWB is made common to a plurality of memory mats 30 arranged in the transverse direction. Many sub-word lines SW are arranged for every memory mat 30. A selection signal to be transmitted to the main word line MWB and predecoding signals FXB0 to FXB7 are used for selection of sub-word lines SW. The predecoding signals are used for one memory mat 30, divided into a group of FXB0, FXB2, FXB4, and FXB6 and a group of FXB1, FXB3, FXB5, and FXB7, and individually supplied to sub-word drivers 51 in groups of four on both sides of the memory mat 30. The main word line MWB is connected in common to sub-word drivers 51 in groups of four in the memory mat 30. The main word line MWB driven to a selection level selects a group of eight sub-word lines SW on the right and left sides of each memory mat and the predecoding signals FXB0 to FXB7 can be regarded as signals for selecting one sub-word line out of a group of eight sub-word lines. The predecoding signals FXB0 to FXB7 are output from a not-illustrated predecoder included in the peripheral circuit 14. The predecoder decodes part of address signals to generate the predecoding signals FXB0 to FXB7. Details of the main- and sub-word line structure, that is, a hierarchical word line system are described in, for example, ESSCIRC Dig. Tech. Papers, September 1992, pp. 131–134.

Figure 13:
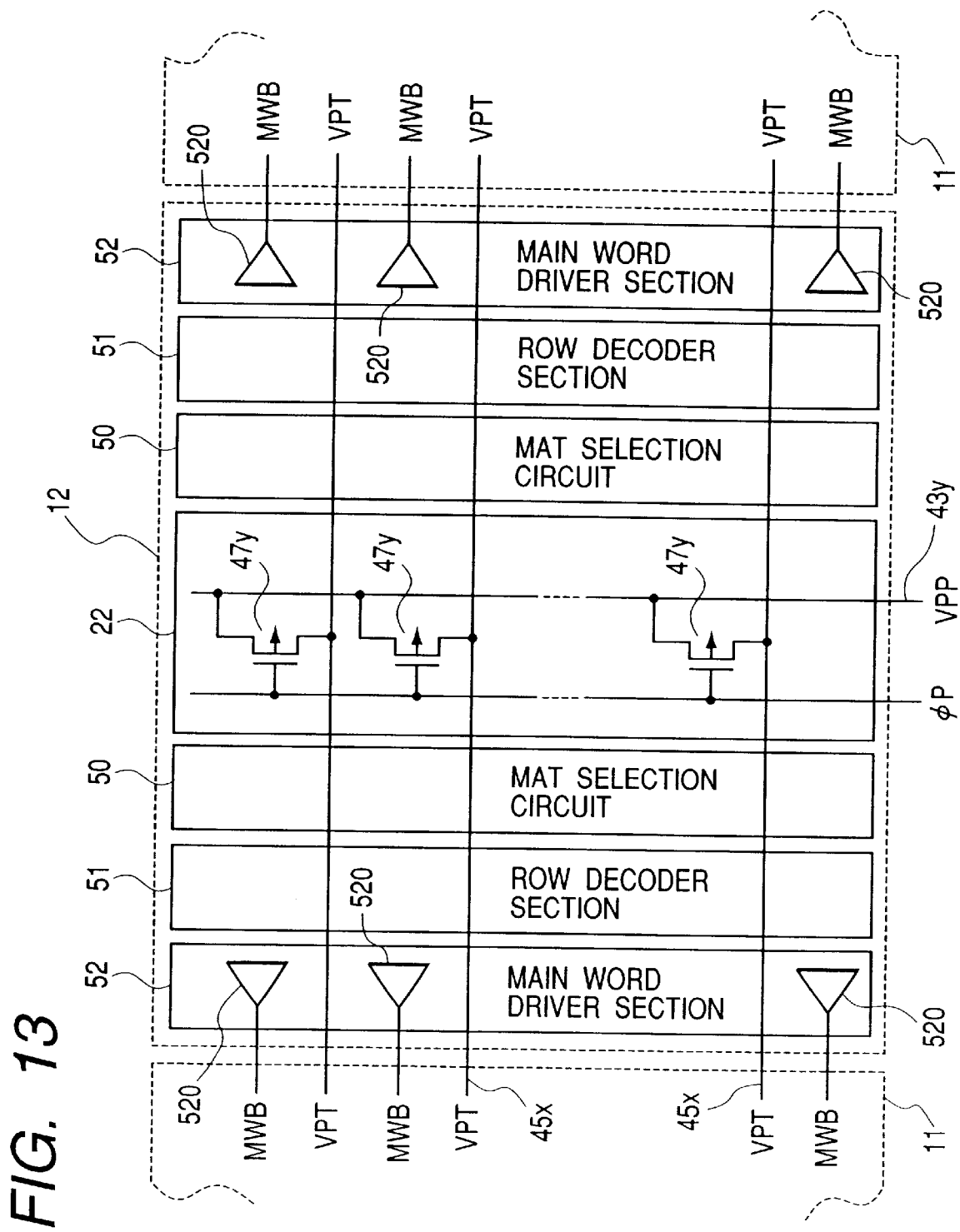
FIG. 13 is a block diagram showing a row decoder included in the DRAM of FIG. 10.

FIG. 13 shows a detailed example of the row decoder section 12. The row decoder section 12 is used by the right and left memory array sections 11 in common. A mat selection circuit 50 selects a pair of right and left memory mats 30 by using part of the address signals. A row decoder section 51 decodes part of the address signals to generate a selection signal for a main word line MWB. A main word driver section 52 has a main word driver 520 for each main word line MWB, and the main word line selection signal is supplied to each main word driver 520 in one-to-one correspondence.

The sub-power supply lines 45y shown in FIG. 11 use the metal wiring layer of the third layer (the same wiring layer as the output line of the column decoder section 13) and the X-direction sub-power supply lines 45x use the second metal wiring layer (the same wiring layer on the same layer as a main word line MWB). The wiring pitches between the output lines of the column decoder section 13 and those between main word lines generally have enough allowances compared to the minimum process size of wiring. According to FIG. 12, a main word line MWB is provided for every eight sub-word lines SW, and a sub-word line SW is formed with, for example, a polysilicon wiring layer. Moreover, the output line of a column decoder is provided for every complementary bit line or a plurality of complementary bit lines. Therefore, it is possible to arrange the sub-power supply lines 45x and 45y without adding a new wiring layer or specially forming a region dedicated to sub-power supply lines. The sub-power supply lines 45x and 45y are connected to each other through through-holes. Therefore, it is possible to arrange the sub-power supply lines 45x and 45y in the memory array section 11 like a mesh without increasing the number of fabrication steps or the chip size. Thereby, it is possible to reduce the voltage drop of the sub-power supply lines and increase the speed of the circuit operation similarly to the above mentioned arrangement. The same holds true for sub-power supply lines on the ground voltage VSS side though not illustrated in FIG. 11.

Figure 14:
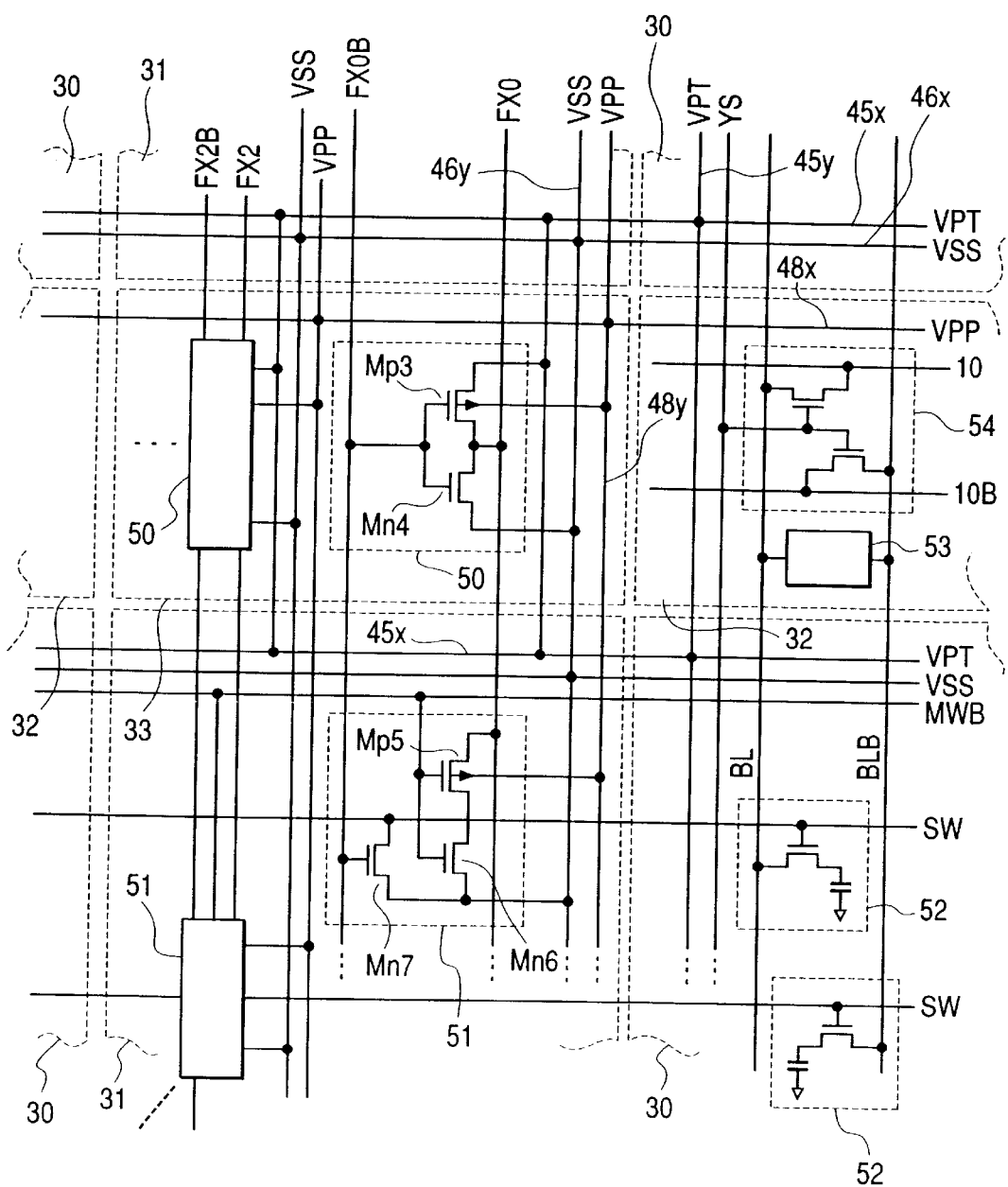
FIG. 14 is a circuit diagram nearby the sub-word driver section and MOS logic circuit included in the DRAM of FIG. 10.

FIG. 14 shows a circuit structure around the sub-word driver section 31 and MOS logic circuit 33.

The MOS logic circuit 33 has CMOS inverters 50 for supplying operating power to sub-word drivers 51. The CMOS inverters 50 invert sub-decoding signals FX0B, FX2B, . . . generate signals FX0, FX2, . . . High levels of the signals FX0B, FX2B, . . . , and FX0, FX2, . . . are the boosted voltage VPP and low levels of them are the ground voltage VSS. The CMOS inverter 50 comprises a p-channel MOS transistor Mp3 and an n-channel MOS transistor Mn4.

The sub-word driver 51 comprises a p-channel MOS transistor Mp5 and an n-channel MOS transistors Mn6 and Mn7, and used as a NOR gate. Corresponding predecoding signals FX0B, FX2B, . . . are supplied to the gate of the MOS transistor Mn7, and corresponding main word line MWB is connected to the gates of the MOS transistors Mp5 and Mn6. The sub-word driver 51 drives a sub-word line SW to the voltage VPT equal to the boosted voltage VPP only when the main word line MWB corresponding to the driver 51 is at the low-level, and the signals FX0B, FX2B, . . . corresponding to the driver 51 are at the low-level (FX0, FX2, . . . are at the high-level). The voltage VPT is supplied to the sub-word driver 51 as high-level outputs FX0, FX2, . . . of the CMOS inverter 50.

The signals FX0B, FX2B, . . . are at the high-level (=VPP) and the signals FX0, FX2, . . . are at the low-level in the wait state of a DRAM. Therefore, a subthreshold current flows through the p-channel MOS transistor Mp3 constituting the CMOS inverter 50. In this case, the source of the MOS transistor Mp3 is connected to the sub-power supply line 45x, and the sub-power supply line 45x is connected to the main power supply line 43y through the switching MOS transistor 47y. Even in the standby state, the boosted voltage VPP is supplied to the main power supply line 43y. In the wait state, the switching MOS transistors 47y and 47x are controlled to be off. Therefore, the voltage VPT is lower than the boosted voltage VPT in the standby state, and, thereby, the gate potential of the MOS transistor Mp3 is higher than the source potential of the transistor Mp3 and the subthreshold current is controlled. The lines shown by symbols 46x and 46y in FIG. 14 are sub-power supply lines on the ground voltage VSS side not illustrated in FIG. 11.

In the case of the structure in FIG. 14, not the voltage VPT but the boosted voltage VPT is supplied to the back gate of or the n-well region of the p-channel MOS transistor Mp3. The reason for this is that, when the potential of the voltage VPT is lowered in the standby state, a back-gate bias is applied to the MOS transistor Mp3 and the threshold voltage of the MOS transistor Mp3 is lowered (the absolute value of the threshold voltage increases) to act to reduce the subthreshold current. Power supply lines 48x and 48y are exclusively used to supply the boosted voltage VPP as a back-gate bias voltage. Therefore, because it is unnecessary to supply a large current, there is no problem even if the lines 48x and 48y have a rather large resistance. Therefore, the widths of the power supply lines 48x and 48y can be decreased compared to the widths of the sub-power supply lines 45x and 45y for supplying the voltage VPT, and, thereby, it is possible to save on the amount of the area occupied by the chip.

In FIG. 14, symbol 52 denotes a dynamic memory cell having its selection terminal is connected to a sub-word line SW, and its data input/output terminal connected to complementary bit lines BL and BLB.

In FIG. 14, symbol 53 denotes a sense amplifier included in the sense amplifier section 32 and the sense amplifier 53 is provided for every complementary bit line BL and BLB to amplify the very small potential difference between the complementary bit lines BL and BLB. The complementary bit lines BL and BLB are connected to common data lines IO and IOB through a column selection gate 54. The column selection gate 54 is switching-controlled by a column selection signal YS output from the column decoder section 13.

In FIG. 13, the mat selection circuits 50, row 10 decoder sections 51, and main word driver sections 52 are arranged on both sides of a region 22 in which the switching MOS transistors 47y for an SCRC is provided. The sub-power supply lines 45x is formed with the same wiring layer as the layer of main word lines MWB, and provided in the extra region between the main word lines MWB. The switching MOS transistors 47y are shared by the right and left memory array sections 11. Because the right and left memory array sections 11 are not selected at the same time, the channel width of the switching MOS transistor 47y needs only to be set to a value capable of supplying power to either memory array section 11. Therefore, even if a structure sharing the switching MOS transistors 47y by the right and left memory array sections ii is used, it is unnecessary to double the channel width of the MOS transistors 47y.

Figure 15:
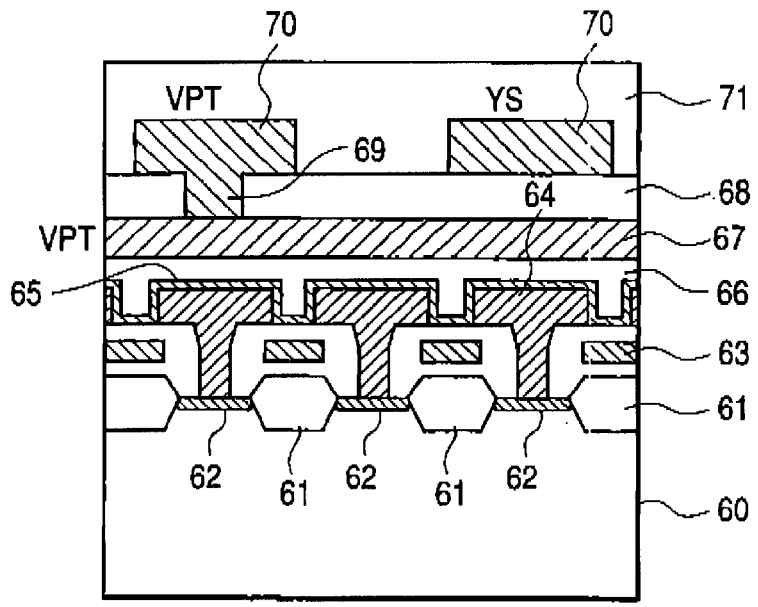
FIG. 15 is a partly sectional view of a memory mat included in the DRAM of FIG. 10.

FIG. 15 shows a partly sectional view of the memory mat 30. In FIG. 15, symbol 60 denotes a p-type substrate, 61 denotes an element isolation oxide film, 62 denotes an n-type diffusion layer, and 63 denotes a first metal wiring layer used for bit lines BL and BLB. Because a sub-word line SW passes over or under the paper, it is not shown in FIG. 15.

In this case, a stacked capacitor is used as a memory cell. The capacitor comprises a storage electrode 64, a counter electrode 65, and an insulating film (not illustrated) formed between the electrodes 64 and 65. Symbol 66 denotes an interlayer insulating film. Symbol 67 denotes a second metal wiring layer which is used for the sub-power supply lines 45x. Though not illustrated, a main word line MWB is also formed with the second-metal wiring layer, and provided in parallel with the sub-power supply lines 45x. Symbol 70 denotes a third metal wiring layer which is used for the sub-power supply lines 45y as well as the wiring for a column selection signal YS output from a column decoder. Symbol 69 denotes a through hole formed in an interlayer insulating film 68 to connect sub-power supply lines to each other. The same holds true for the sub-power supply lines 46x and 46y on the ground voltage VSS side. Symbol 71 denotes a surface passivation film.

A wiring for the column selection-signal YS is generally formed for every two or four pairs of complementary bit lines. That is, a column selection signal line is formed for every four or eight lines of first metal wiring layer. Therefore, the wiring pitch still has an allowance in general even when considering the fact that the minimum process size of the third metal wiring layer is larger than that of the first metal wiring layer, and it is possible to pass other wiring lines such as sub-power supply lines between the lines for the column selection signal YS.

Thus, because the sub-power supply lines 45x, 15 45y, 46x, and 46y are formed with the same wiring layer as the wirings for the main word line MWB and column selection signal, it is possible to realize the mesh-like wiring without adding another wiring layer.

The invention made by the present inventor has been specifically described as related to the embodiments. However, it is not restricted to the embodiments. It is needless to say that various modifications of the present invention can be made as long as they do not deviate from the gist of the present invention. For example, it is possible to change a MOS logic circuit, which is an object of an SCRC to another appropriate circuit without being restricted to a CMOS inverter. Moreover, the MOS logic circuit can be a push-pull circuit using an n-channel MOS transistor without being restricted to a CMOS circuit. When applying the present invention to a DRAM, the object of an SCRC is not restricted to the CMOS inverter 50. It is also possible to apply the present invention to the power supplying circuit section of a main word driver or that of a column decoder.

The present invention can be applied to other memories such as an SRAM (static Random Access Memory) and ROM (Read Only Memory), and, moreover, to various semiconductor integrated circuits including a logic LSI. The present invention can be widely used for semiconductor integrated circuits in which it is desired for the subthreshold current to be reduced and the operating speed to be increased.

Advantages obtained from a typical invention among the inventions disclosed in this application will be described below.

That is, a plurality of switching MOS transistors for selectively connecting main power supply lines to subpower supply lines are dispersedly arranged on one main power supply line. By dispersedly arranging the switching MOS transistors on the main power supply line, it is possible to reduce the equivalent wiring resistance of the sub-power supply lines compared to the case where the switching MOS transistors are provided at one place. Moreover, by arranging sub-power supply lines like a mesh and supplying power from two directions of the main power supply line along two adjacent sides of a rectangular region, the equivalent wiring resistance of the sub-power supply lines is further reduced. When the equivalent resistance of the sub-power supply lines is reduced, the voltage drop is reduced on the sub-power supply lines in the operable state of the MOS logic circuit. Therefore, it is possible to prevent the operating speed of the MOS logic circuit from lowering even if the subthreshold current is reduced. Moreover, it is possible to reduce the power consumption of the semiconductor integrated circuit in the wait state.

We claim:

1. A semiconductor integrated circuit comprising:
   a plurality of sets of logic circuits formed over a semiconductor substrate;
   a plurality of first sub-power supply lines extending in a first direction;
   a plurality of second sub-power supply lines, each connected at two or more intersection portions to said first sub-power supply lines, extending in a second direction crossing to said first direction;
   a main power supply line extending in said second direction; and
   a plurality of first switching transistors for connecting said first sub-power supply lines to said main power supply line extending in said second direction,
   wherein said plurality of sets of logic circuits are connected to said plurality of first sub-power supply lines, respectively, so that a plurality of said logic circuits are arranged along each of said first sub-power supply lines in said first direction so that said logic circuits are arranged along said first sub-power supply lines to extend perpendicular to said main power supply line;
   wherein said first switching transistors are kept off in an operation stop state of said logic circuits,
   wherein said first switching transistors are kept on in an operable state of said logic circuits.

2. A semiconductor integrated circuit according to claim 1, further comprising:
   another main power supply line; and
   a plurality of second switching MOS transistors for connecting said second sub-power supply lines to said another main power supply line,
   wherein said second switching transistors are kept off in an operation stop state of said logic circuits and kept on in an operable state of said logic circuits.

3. A semiconductor integrated circuit according to claim 1, wherein said main power supply line extending in said second direction includes a first main power supply line to which a first power supply voltage is supplied and a second main power supply line to which a second power supply voltage having a level lower than that of said first power supply voltage is supplied,
   wherein a predetermined set of logic circuits among said sets of logic circuits includes a p-channel MOS transistor, and
   wherein the source of said p-channel MOS transistor is connected to said first main power supply line through a corresponding first switching transistor.

4. A semiconductor integrated circuit according to claim 3,
   wherein the predetermined set of logic circuits among said sets of logic circuits includes an n-channel transistor, and
   wherein the source of said n-channel transistor is connected to said second main power supply.

5. A semiconductor integrated circuit according to claim 2,
   wherein said main power supply line extending in said second direction includes a first main power supply line to which a first power supply voltage is supplied and second main power supply line to which a second power supply voltage having a level lower than that of the first power supply line is supplied,
   wherein said another main power supply line includes a third main power supply line to which the first power supply voltage is supplied and a fourth main power supply line to which the second power supply voltage is supplied, and
   wherein said sets of logic circuits each include a p-channel MOS transistor, the source of said p-channel MOS transistor is connected to said first main power supply line through a corresponding first switching transistor, and the source of said p-channel MOS transistor is connected to said third main power supply line through a corresponding second switching transistor.

6. A semiconductor integrated circuit according to claim 5,
   wherein each of said sets of logic circuits includes an n-channel MOS transistor, the source of said n-channel MOS transistor is connected to said second main power supply line through a corresponding first switching transistor, and the source of said n-channel MOS transistor is connected to said fourth main power supply line through a corresponding second switching transistor.

7. A semiconductor integrated circuit comprising:
   a plurality of memory mats including plural memory cells each having a selection terminal connected to a word line and being arranged like an array;
   word drivers which selectively drives the word lines, regularly provided between said memory mats arranged like an array;
   a plurality of sets of MOS logic circuits which supply a word-line driving voltage to said word drivers, regularly provide between said memory mats arranged like an array;
   first sub-power supply lines extending in a first direction, each of which is connected to at least a corresponding one of said plurality of sets of MOS logic circuits so that a plurality of said MOS logic circuits are arranged along each of said first sub-power supply lines in said first direction,
   second sub-power supply lines, extending in a second direction perpendicular to said first direction, each connected to two or more of said first sub-power supply lines at intersection portions thereof;
   a main power supply line extending in said second direction so that said logic circuits are arranged along said first sub-power lines to extend perpendicular to said main power supply line; and
   a plurality of switching MOS transistors which respectively connect said first sub-power supply lines to said main power supply line, wherein said switching MOS transistors are kept off in a standby state of said MOS logic circuits and kept on in an operable state of the MOS logic circuits.

8. A semiconductor integrated circuit according to claim 7, wherein a boosted voltage is supplied to said main power supply line and the well region of a p-channel MOS transistors provided in said MOS logic circuits and connected to said first sub-power supply line at the source.

9. A semiconductor integrated circuit according to claim 7, wherein an operation stop state is designated correspondingly to a chip non-selected state.

10. A semiconductor integrated circuit according to claim 7, wherein the connection points between first sub-power supply lines and second sub-power supply lines are arranged over said memory mats.

11. A semiconductor integrated circuit according to claim 7, wherein said memory cells are dynamic memory cells.

12. A semiconductor integrated circuit comprising:

a plurality of memory mats including plural memory cells each having a selection terminal connected to a word line and being arranged like an array;

word drivers which selectively drives the word lines, regularly provided between said memory mats arranged like an array;

a plurality of sets of MOS logic circuits which supply a word-line driving voltage to said word drivers, regularly provide between said memory mats arranged like an array;

first sub-power supply lines, extending in a first direction, each of which is connected to at least a corresponding one of said plurality of sets of MOS logic circuits so that a plurality of said MOS logic circuits are arranged along each of said first sub-power supply lines in said first direction, second sub-power supply lines, extending in a second direction perpendicular to said first direction, connected to said first sub-power supply lines at intersection portions thereof;

a main power supply line extending in said second direction so that said logic circuits are arranged along said first sub-power lines to extend perpendicular to said main power supply line; and a plurality of switching MOS transistors which respectively connect said first sub-power supply lines to said main power supply line, wherein said switching MOS transistors are kept off in a standby state of said MOS logic circuits and kept on in an operable state of the MOS logic circuits, wherein a selection signal is supplied to a group of said word drivers from a common main word line, said sets of MOS logic circuits supply a word line driving level of said first sub-power supply lines to said word drivers in accordance with a decoding signal for selecting one of said word drivers, and wherein said first sub-power supply lines are formed with the same wiring layer as the main word line.

* * * * *